United States Patent
Kimura et al.

(10) Patent No.: US 6,580,147 B2
(45) Date of Patent: Jun. 17, 2003

(54) SEMICONDUCTOR DEVICE HAVING BUILT-IN CAPACITORS

(75) Inventors: Toru Kimura, Tokyo (JP); Dai Nakajima, Tokyo (JP); Tatsuya Okuda, Tokyo (JP); Takeshi Ohi, Tokyo (JP); Takanobu Yoshida, Tokyo (JP); Naoki Yoshimatsu, Fukuoka (JP); Yuuji Kuramoto, Tokyo (JP); Toshinori Yamane, Tokyo (JP); Masakazu Fukada, Tokyo (JP); Majumdar Gourab, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 48 days.

(21) Appl. No.: 09/805,576

(22) Filed: Mar. 14, 2001

(65) Prior Publication Data

US 2001/0035562 A1 Nov. 1, 2001

(30) Foreign Application Priority Data

Mar. 14, 2000 (JP) ........................................ 2000-069770

(51) Int. Cl.$^7$ ............................................... H01L 29/00
(52) U.S. Cl. ....................................................... 257/532
(58) Field of Search ............................... 257/530–535; 363/97–98, 132, 16–17

(56) References Cited

U.S. PATENT DOCUMENTS 5,835,371 A * 11/1998 Kume et al. ................. 363/132
6,327,165 B1 * 12/2001 Yamane et al. ............. 363/132

FOREIGN PATENT DOCUMENTS

JP          10-285907          10/1998

\* cited by examiner

Primary Examiner—Cuong Quang Nguyen
(74) Attorney, Agent, or Firm—Burns, Doane, Swecker & Mathis, LLP

(57) ABSTRACT

P-electrode 30a and N-electrode 31a of a semiconductor device 2, and capacitors 10 in a plate-like shape or a block-like shape respectively connected to U-phase 40, V-phase 41, and W-phase 42 having a switching element 20 and a diode 21 are built in a semiconductor device 2, and a single or a plurality of capacitors 10 are respectively connected to P-electrodes 30a and N-electrodes 31a in each of the phases, whereby the smoothing capacitors are built in the semiconductor device to reduce wiring inductances, the capacitors are miniaturized, and an entire electric power converting device, i.e. inverter, is miniaturized.

20 Claims, 15 Drawing Sheets

```
2  :  semiconductor device
10 :  capacitor
20 :  switching element
21 :  diode
25 :  insulating substrate
30 :  P-terminal
30a:  P-electrode
31 :  N-terminal
31a:  N-electrode
32 :  U-terminal
33 :  V-terminal
34 :  W-terminal
40 :  U-phase
41 :  V-phase
42 :  W-phase
```

| | |
|---|---|
| 2: | semiconductor device |
| 10: | capacitor |
| 20: | switching element |
| 21: | diode |
| 25: | insulating substrate |
| 30: | P-terminal |
| 30a: | P-electrode |
| 31: | N-terminal |
| 31a: | N-electrode |
| 32: | U-terminal |
| 33: | V-terminal |
| 34: | W-terminal |
| 40: | U-phase |
| 41: | V-phase |
| 42: | W-phase |

45, 46: interphase connecting conductor

47: insulating plate

48: bonding layer

65: printed wiring board

75: through hole

12: capacitor module
12a, 12b: outer terminal
65a: underfill
65b: joining material 51: slit F I G. 9 (a)
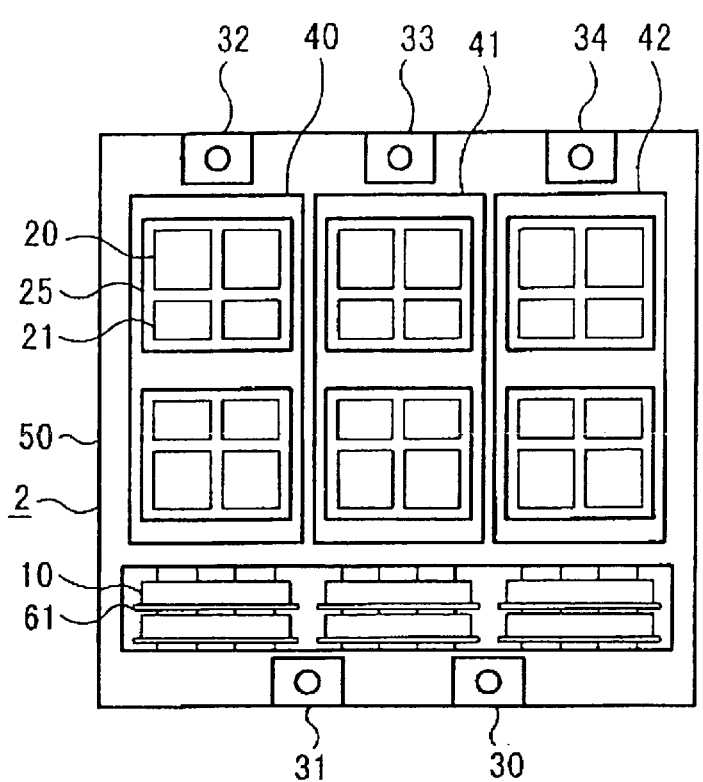
F I G. 9 (b)
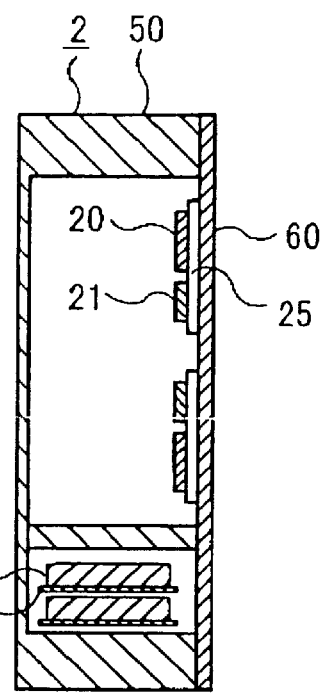
61: supporting plate 62, 63: conductor F I G. 13 (a)
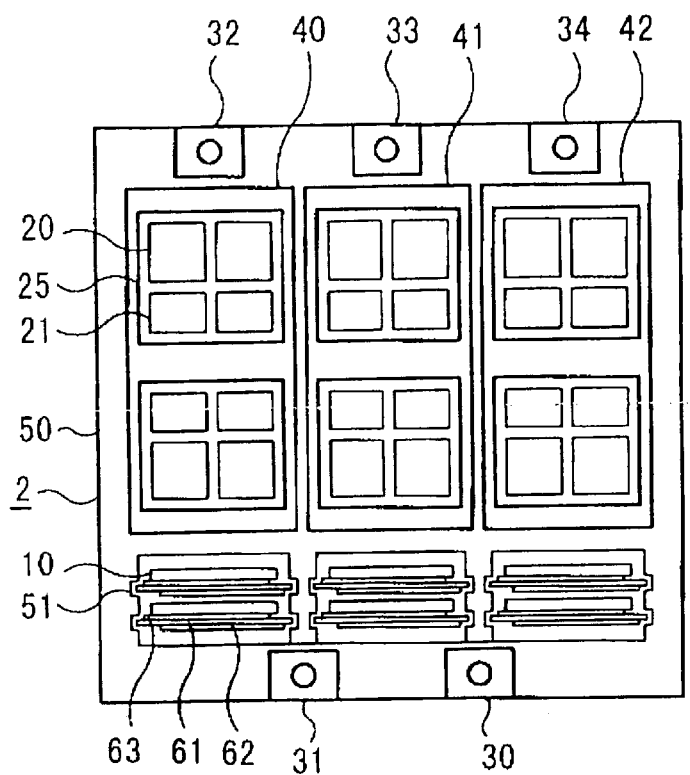
F I G. 13 (b)
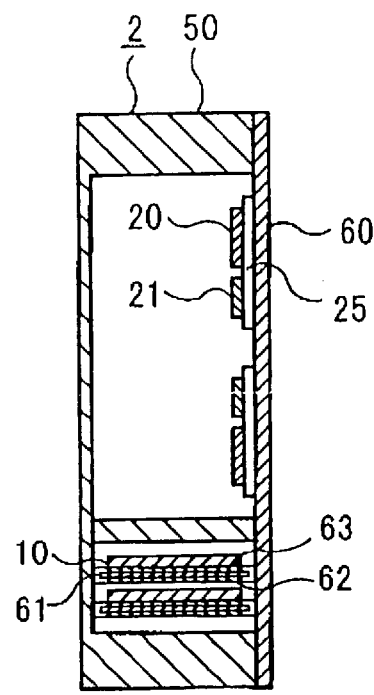

FIG. 15 (a)
FIG. 15 (b)
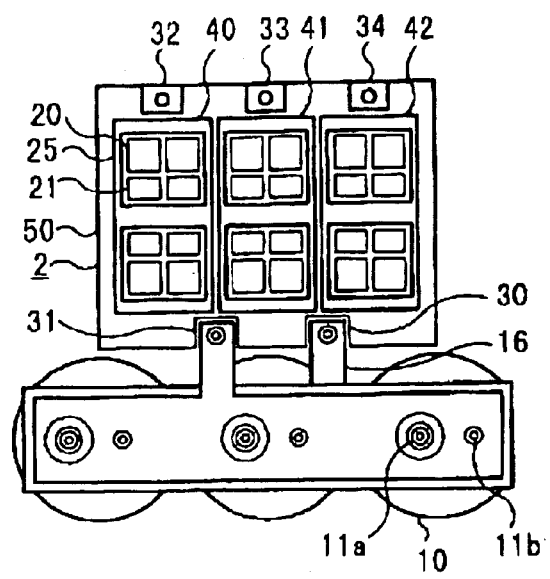
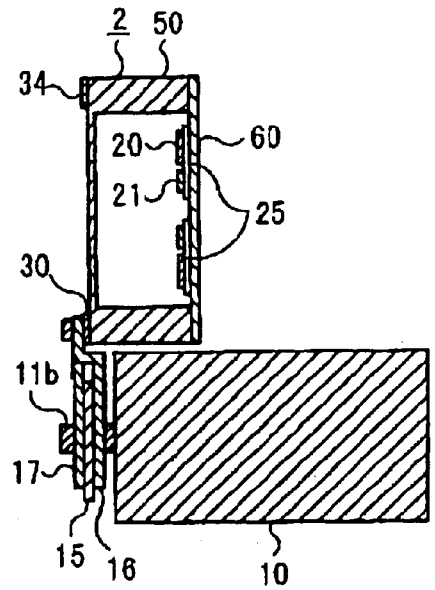
FIG. 15 (c)
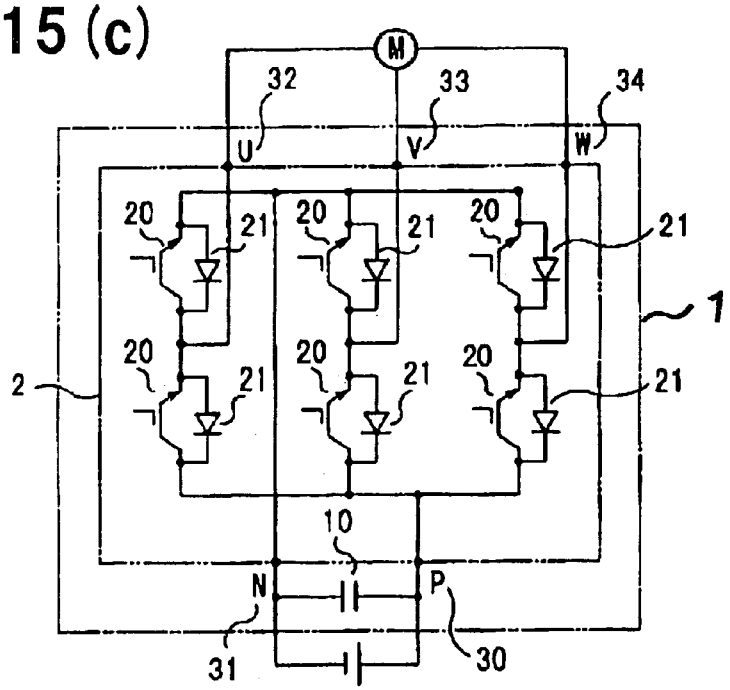

SEMICONDUCTOR DEVICE HAVING BUILT-IN CAPACITORS

BACKGROUND OF THE INVENTION

1. Field of the Invention

The present invention relates to a semiconductor device used in an inverter.

2. Discussion of Background

An inverter is widely used in various electrical apparatuses for consuming public and industries. For example, in electric automobiles, propelled by a.c. motors, and hybrid cars, propelled by engines and a.c. motors, as illustrated in FIG. 15(c), an inverter 1 is interposed between a motor and a d.c. power source. The inverter 1 is formed by a semiconductor device 2, and a capacitor 10, located outside the semiconductor device 2, as illustrated in a plan view of FIG. 15(a) and a cross-sectional view of FIG. 15(b). The capacitor 10 is necessary to suppress a voltage regulation of ripple of the d.c. power source. The semiconductor device 2 converts a d.c. current to an a.c. current or convert an a.c. current to a d.c. current by switching elements 20 and diodes 21, both of which are mounted on an insulated board 25. In a case of using a three-phase alternating motor, the semiconductor device 2 should have three-phases of U-phase 40, V-phase 41, and W-phase 42. The insulated board 25 is mounted on a heat dissipating plate 60, and the heat dissipating plate 60 is fixed to a casing 50, made of a synthetic resin. A plurality of conductors are inserted and formed in the casing 50 for internal wiring. The conductors are exposed from a front surface of the casing 50 to form P-terminal 30 and N-terminal 31 on a d.c. current side and U-terminal 32, V-terminal 33, and W-terminal 34 on an a.c. current side, wherein the terminals are connected to the switching elements 20 and the diodes 21 by a wiring pattern and aluminum wires (not shown), formed on a front surface of the insulated board 25. A circuit illustrated in FIG. 15(c) is thus fabricated. The d.c. power source is connected to P-terminal 30 and N-terminal 31, and the three-phase alternating motor is connected to U-terminal 32, V-terminal 33, and W-terminal 34 on the a.c. current side.

As described, when the inverter is formed in the conventional semiconductor device, the capacitors 10 are arranged outside the semiconductor device 2, and as illustrated in FIGS. 15(a) and (b), in order to connect electrode terminals 11a and 11b of the capacitor 10 with P-terminal 30 and N-terminal 31 of the semiconductor device, busbars 16 and 17, insulated by an insulating plate 15, become necessary, whereby the number of components forming the inverter is increased, an assemble is onerous, and a cost is increased.

Further, since the capacitor 10 is arranged outside the semiconductor device 2, a wiring path between the capacitor 10 and the switching element 20 inside the semiconductor device 2 is long, an inductance is increased, and it is necessary to increase an electric strength of the elements to withstand a large surge voltage, whereby the cost is increased. Further, in order to suppress a ripple voltage of the d.c. power source caused by the increment of the inductance, it is necessary to increase a capacitance of the capacitor 10, whereby the size of the capacitor 10 and accordingly the size of the inverter 1 become large.

Further, an electrolytic capacitor shaped like a cylinder is generally used to keep a capacitance large, wherein it becomes difficult to effectively use a space, and miniaturization of the inverter 1 is obstructed.

In Japanese Unexamined Patent Publication JP-A-10-285907, an IGBT module is described, wherein an IGBT, a back-flow diode, and a snubber diode are commonly mounted on a planner electrode to reduce a path of wiring from a smoothing capacitor to a module, the planner electrode is mounted on a metallic plate through an insulating plate, and the metallic plate, a snubber capacitor, a gate circuit, and a protection circuit are commonly accommodated in an outer casing.

However, since the capacitors are arranged outside the conventional inverter, the number of components of the inverter is increased, an assemble is onerous, and a cost is increased.

Further, in the IGBT module, disclosed in JP-A-10-285907, it is necessary to locate the smoothing capacitors outside the IGBT module to form an inverter, and there is a limit in reducing an inductance of wiring from the smoothing capacitors to the IGBT module. Therefore, it is necessary to provide the snubber capacitors to suppress a surge voltage, whereby the number of components of the inverter is increased, an assemble is onerous, the size of the IGBT module is increased, the size of the smoothing capacitor is increased, and accordingly the size of the inverter is increased as a whole.

SUMMARY OF THE INVENTION

It is an object of the present invention to solve the above-mentioned problems inherent in the conventional technique and to provide a semiconductor device having a built-in smoothing capacitors in order to miniaturize the capacitors by reducing wiring inductances and resultantly miniaturize a power conversion device (inverter) as a whole.

Another object of the present invention is to reduce the number of components and make an assemble easy.

According to a first aspect of the present invention, there is provided a semiconductor device comprising P-electrodes and N-electrodes; and capacitors in a form of flat plate or block, connected to a plurality of phases, respectively connected to switching elements and diodes, wherein a single or a plurality of the capacitors are respectively connected to the P-electrodes and the N-electrodes.

According to a second aspect of the present invention, there is provided the semiconductor device according to the first aspect of the invention, wherein each of the P-electrodes and each of the N-electrodes are electrically connected between the switching elements and the capacitors through interphase connecting conductors.

According to a third aspect of the present invention, there is provided the semiconductor device according to the second aspect of the invention, wherein the number of the interphase connecting conductors is at least two, one of the interphase connecting conductors is connected to each of the P-electrodes, the other interphase connecting conductor is connected to each of the N-electrodes, and the interphase connecting conductors are closely arranged so as to be mutually overlapped.

According to a fourth aspect of the present invention, there is provided the semiconductor device according to the third aspect of the invention, wherein the interphase connecting conductors are shaped like a flat plate.

According to a fifth aspect of the present invention, there is provided the semiconductor device according to the fourth aspect of the invention, wherein an insulating plate is provided between the interphase connecting conductors, shaped like a flat plate.

According to a sixth aspect of the present invention, there is provided the semiconductor device according to the fifth aspect of the invention, wherein the interphase connecting conductors, shaped like the flat plate, are bonded to the insulating plate by a bonding layer.

According to a seventh aspect of the present invention, there is provided the semiconductor device according to the fifth aspect of the invention, wherein the interphase connecting conductors are formed in a printed wiring board.

According to an eighth aspect of the present invention, there is provided the semiconductor device according to the sixth or seventh aspect of the invention, outer electrodes on one side of the capacitors are connected to one of the interphase connecting conductors, and the other outer electrodes of the capacitors are connected to the other interphase connecting conductors.

According to a ninth aspect of the present invention, there is provided the semiconductor device according to the second aspect of the invention, wherein slits are formed in a casing of the semiconductor device, and the interphase connecting conductors are aligned and supported by the slits.

According to a tenth aspect of the present invention, there is provided the semiconductor device according to the first aspect of the invention, wherein the capacitors are supported by a supporting plate.

According to an eleventh aspect of the present invention, there is provided the semiconductor device according to the first aspect of the invention, wherein a plurality of capacitors are fixed to a side surface or both surfaces of the supporting plate.

According to a twelfth aspect of the present invention, there is provided the semiconductor device according to the tenth or eleventh aspect of the invention, wherein slits are formed in the casing of the semiconductor device, and the supporting plate is registered and supported by the slits.

According to a thirteenth aspect of the present invention, there is provided the semiconductor device according to the tenth or eleventh aspect of the semiconductor device, wherein the supporting plate is made of an insulating material, a plurality of conductors, electrically insulated, are monolithically formed in the supporting plate, and the capacitors are connected to the P-electrode and N-electrode through the conductors.

According to a fourteenth aspect of the present invention, there is provided the semiconductor device according to the tenth or eleventh aspect of the invention, wherein the conductors are formed so as to be mutually overlapped on both surfaces of the supporting plate, made of the insulating material, ones of outer electrodes of the capacitors are connected to the P-electrode through the conductors, formed on one of surfaces of the supporting plate; and the other outer electrodes of the capacitors are connected to the N-electrode through the conductors, formed on the other surface of the supporting plate.

According to a fifteenth aspect of the present invention, there is provided the semiconductor device according to the tenth or eleventh aspect of the invention, wherein an impedance of a current path between various portions of the outer electrodes of the capacitors and P-electrode or N-electrode of a power module is substantially uniformalized.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9(a) is a plan view of an inside of a semiconductor device according to Embodiment 9 of the present invention;

FIG. 9(b) is a cross-sectional view of the semiconductor device according to Embodiment 9 of the present invention;

FIG. 13(a) is a plan view of an inside of a semiconductor device according to Embodiment 13 of the present invention;

FIG. 13(b) is a cross-sectional view of the semiconductor device according to Embodiment 13 of the present invention;

FIG. 15(a) is a plan view of an inside of a conventional inverter;

FIG. 15(b) is a cross-sectional view of the conventional inverter; and

FIG. 15(c) illustrates a circuit structure of the conventional inverter.

DETAILED DESCRIPTION OF THE PREFERRED EMBODIMENTS

A detailed explanation will be given of preferred embodiments of the present invention in reference to FIGS. 1(a) through 14(c) as follows, wherein the same numerical reference are used for the same or similar portions and description of these portions is omitted.

Embodiment 1

Figure 1A:
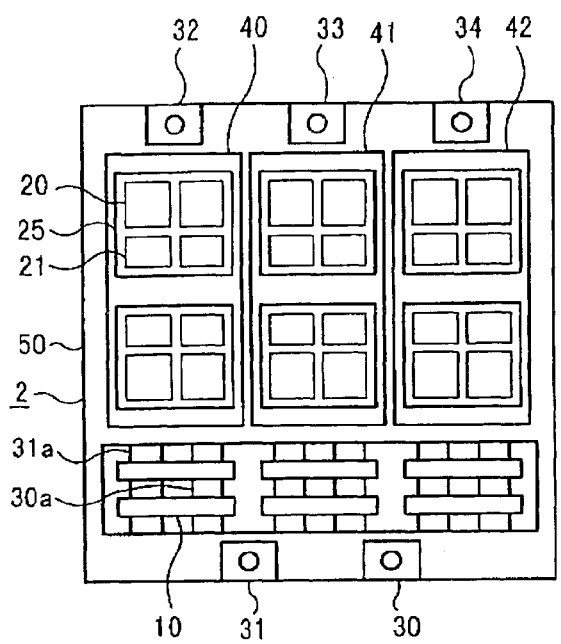
FIG. 1(a) is a plan view of an inside of a semiconductor device according to Embodiment 1 of the present invention.
Figure 1B:
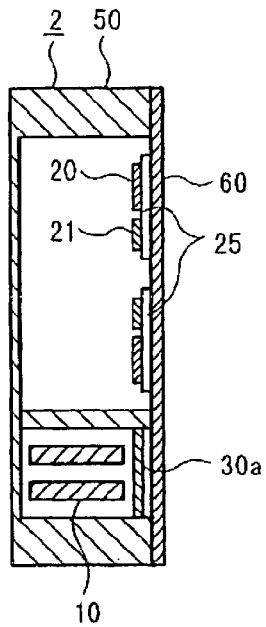
FIG. 1(b) is a cross-sectional view of the semiconductor device according to Embodiment 1 of the present invention.
Figure 1C:
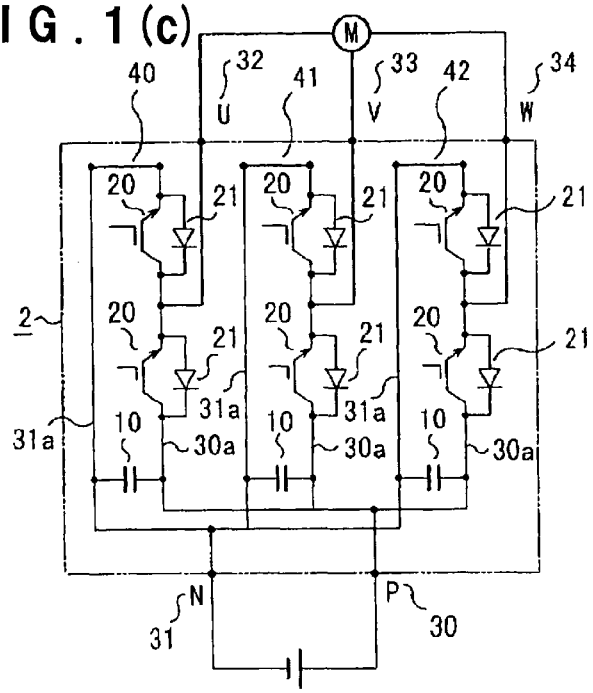
FIG. 1(c) illustrates a circuit structure of the semiconductor device according to Embodiment 1 of the present invention.

FIG. 1(a) is a plan view of an inside of a semiconductor device according to Embodiment 1 of the present invention. FIG. 1(b) is a cross-sectional view of the semiconductor device. FIG. 1(c) illustrates a circuit structure of the semiconductor device. In the semiconductor device 2 according to this embodiment, switching elements 20, diodes 21, and capacitors 10 shaped like a block or a flat plate are respectively provided for three-phases of U-phase 40, V-phase 41, and W-phase 42 such that the switching element 20, the diode 21, and the capacitor 10 are mounted on an insulating board 25 on a heat dissipating plate 60 in a space, formed between a casing 50 and the heat dissipating plate 60. Outer electrodes of the capacitors 10, provided for the three-phases, are respectively connected to conductors 30a and 31a, formed for each of the three-phases. The conductors 30a and 31a are inserted in the casing 50 on ones of ends thereof and connected respectively to P-terminal 30 and N-terminal 31 on a d.c. side, and the other ends thereof are connected to the switching elements 20 and the diodes 21 by wiring patterns (not shown) and aluminum wires (not shown), formed on surfaces of the insulating board 25. A three-phase alternating motor is connected to U-terminal 32, V-terminal 33, and W-terminal 34 on an a.c. side to form a circuit illustrated in FIG. 1(c).

According to this embodiment, by building the capacitors 10 in the semiconductor device, the length of a wiring path between the capacitor 10 and the switching element 20 is shortened, and an inductance can be reduced, whereby a surge voltage can be suppressed, and the switching elements 20 can be prevented from being destroyed.

Further, by reducing an inductance, it becomes possible to suppress a variation of a ripple voltage of the d.c. power source even though a capacitance of the capacitor 10 is small, whereby it is possible to miniaturize the capacitors, and compactness of the semiconductor device 2 is enhanced.

Further, since the capacitors 10 are shaped like a flat plate or a block, not like a cylinder as in a conventional electrolytic capacitor, spaces can be effectively used, and the semiconductor device 2 can be miniaturized.

Further, by building the capacitors 10 in the semiconductor device, a function as an inverter is demonstrated in use of only the semiconductor device 2, whereby the number of components of the inverter can be reduced, an assemble becomes easy, and a cost can be reduced.

Further, when inductances are different with respect to the phases because of ununiform lengths of wiring paths between the capacitor 10 and the switching elements 20 for the three-phases, surge voltages to be generated are different each other. Therefore, it is necessary to provide countermeasures such that electric strengths of the switching elements 20 are improved so as to be withstand a surge voltage, generated in the phase having the largest inductance, and the surge voltage is suppressed by decreasing a switching rate of the switching element 20 in the phase having the largest inductance. However, in both cases, an electric power loss is increased to deteriorate a performance of the semiconductor device. According to this embodiment, because the lengths of wiring paths between the capacitors 10 corresponding to U-phase 40, V-phase 41, and W-phase 42 and the switching elements 20 corresponding to the phases become even, the inductances are uniformalized, surge voltages generated in the phases become even, and an absolute value of the surge voltage can be reduced, whereby a performance of the semiconductor device is improved.

Further, in this embodiment, the semiconductor device 2 has three-phases, this invention is not limited thereto.

Embodiment 2

Figure 2:
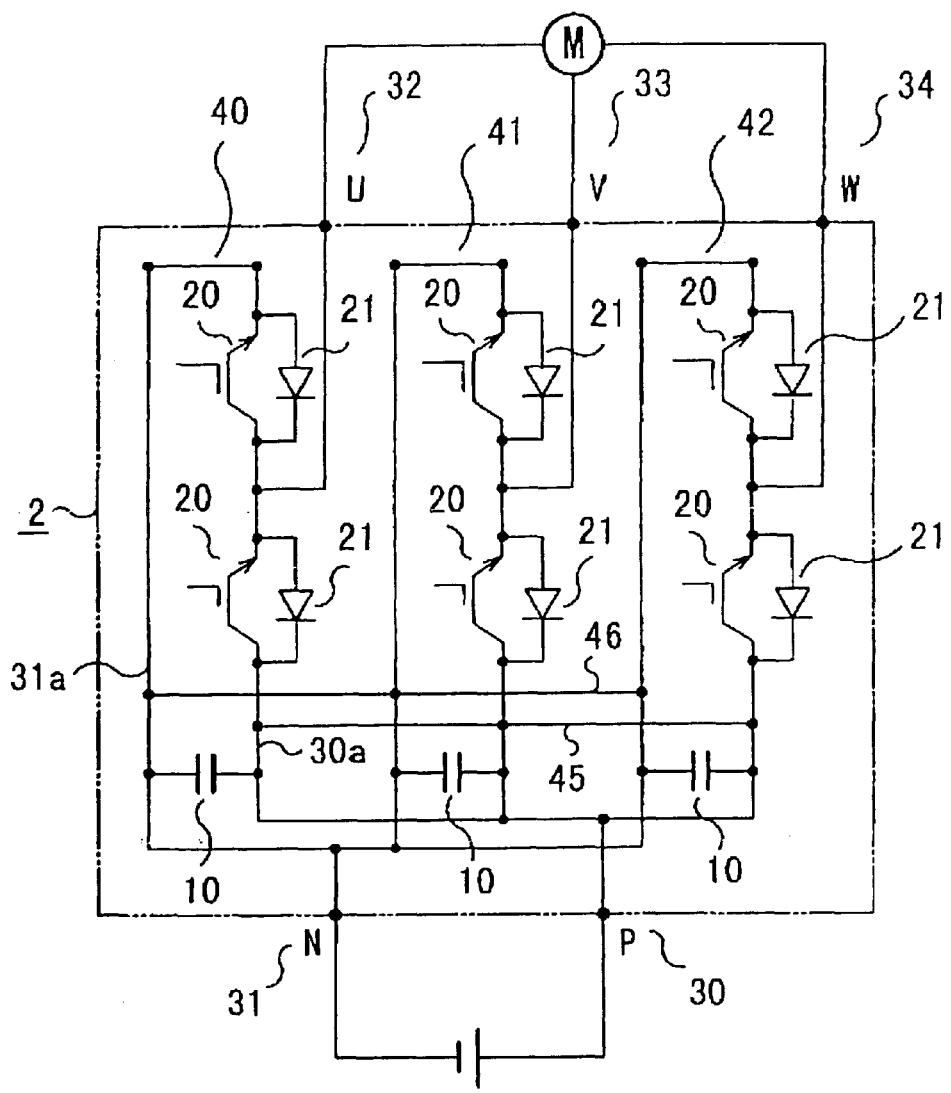
FIG. 2 illustrates a circuit structure of a semiconductor device according to Embodiment 2 of the present invention.

FIG. 2 illustrates a structure of a circuit of a semiconductor device according to Embodiment 2 of the present invention. In this embodiment, conductors 30a and conductors 31a of U-phase 40, V-phase 41, and W-phase 42 are mutually connected between switching elements 20 and capacitors 10 to improve a balance of shunt.

For example, in FIG. 1(c), in order to suppress a variation of a ripple voltage, generated at a time of switching U-phase 40, an electric current is supplied from the capacitor 10 corresponding to U-phase 40, and electric currents are supplied from capacitors 10 corresponding respectively to V-phase 41 and W-phase 42. These electric currents temporarily flow in a direction of P-terminal 30, pass through a portion connecting the conductors 30a of the phases, pass through the conductor 30a in U-phase 40, and flow into U-phase 40. In Embodiment 2, since the conductors 30a in the phases are mutually connected between the switching elements 20 and the capacitors 10, a current path through this interphase connecting portion is shorter than a current pass through the interphase connecting portion closer to P-terminal 30 and N-terminal 31, and has a lower inductance. Therefore, when U-phase 40 is switched, an electric current, supplied from the capacitors 10 corresponding to V-phase 41 and W-phase 42 to U-phase 40 increases in comparison with the circuit structure illustrated in FIG. 1(c), whereby a balance of shunt is improved. Needless to say that this effect is obtained not only in U-phase 40, and similar effects are obtainable when any of the phases is switched. When the balance of shunt is improved, it is possible to suppress a voltage regulation of ripple even though each of capacitances of the capacitors 10 is small, the capacitors 10 can be miniaturized, and the semiconductor device 2 is also effectively miniaturized.

Embodiment 3

Figure 3A:
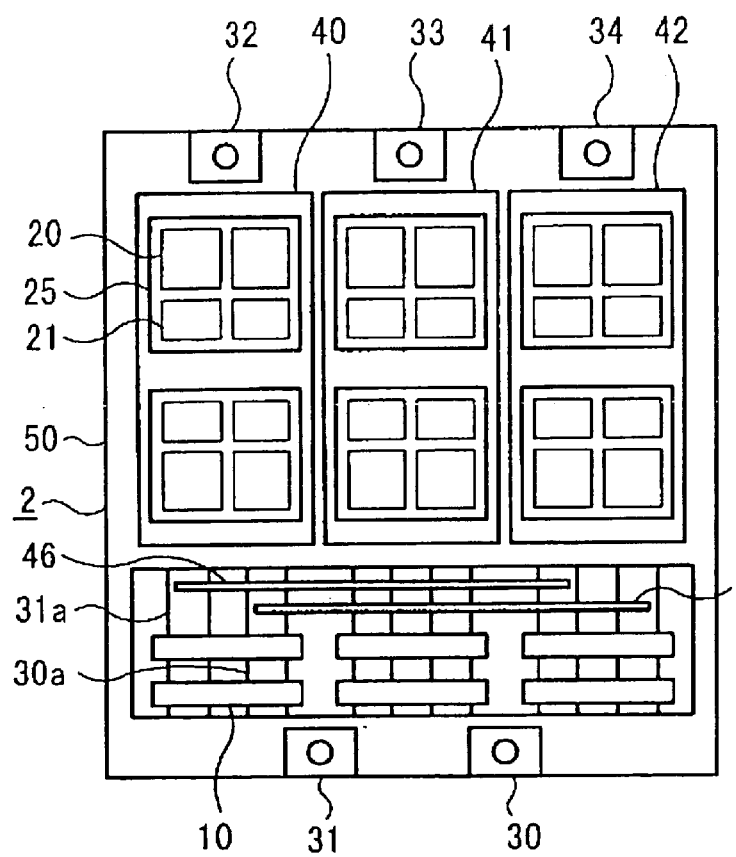
FIG. 3(a) is a plan view of an inside of a semiconductor device according to Embodiment 3 of the present invention.
Figure 3B:
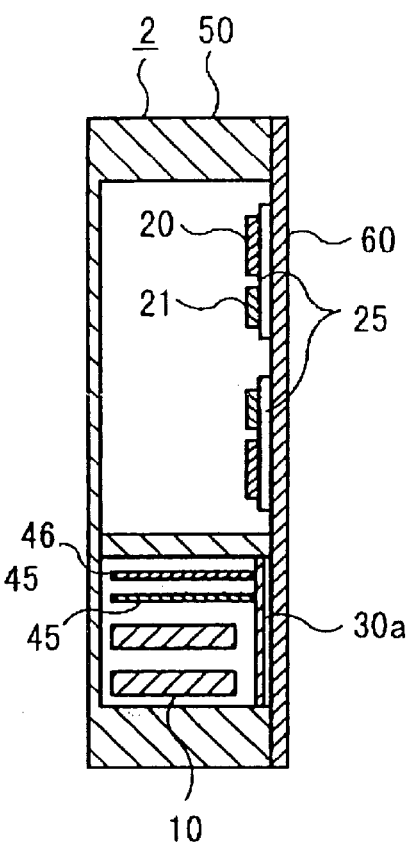
FIG. 3(b) is a cross-sectional view of the semiconductor device according to Embodiment 3 of the present invention.
Figure 3C:
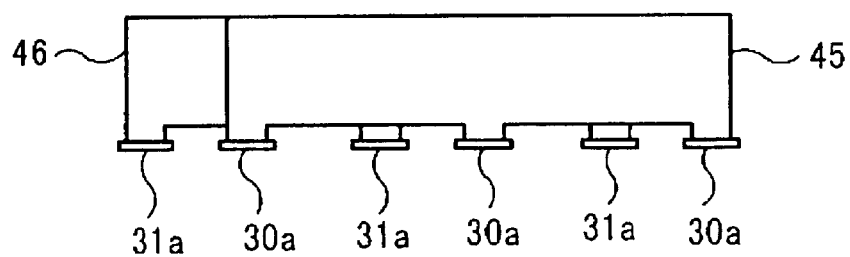
FIG. 3(c) is a front view illustrating an interphase connecting conductor.

FIG. 3(a) is a plan view of an inside of a semiconductor device according to Embodiment 3 of the present invention. FIG. 3(b) is a cross-sectional view of the semiconductor device. FIG. 3(c) is a front view illustrating interphase connecting conductors of the semiconductor device according to Embodiment 3 of the present invention. A circuit structure according to Embodiment 3 is the same as that in FIG. 2. As illustrated in FIG. 3(a) through 3(c), interphase connecting conductors 45 and 46 connect conductors 30a and 31a in three-phases between switching elements 20 and the capacitors 10 in the three-phases, wherein the interphase connecting conductors 45 and 46 are shaped like a flat plate and closely arranged so as to be overlapped each other.

According to Embodiment 3, it is possible to further reduce interphase inductances. For example, when U-phase 40 is switched, currents applied from capacitors 10, corresponding to V-phase 41 and W-phase 42, to U-phase 41 passes through interphase connecting conductors 45 and 46. At this time, a part of the currents flowing from capacitors 10, corresponding to V-phase 41 and W-phase 42, to U-phase flow through the interphase connecting conductor 45 in a direction adverse to a part of the current flowing through the interphase connecting conductor 46, whereby magnetic fields generated by the flows of the currents are cancelled. By an effect of canceling the magnetic fields, the interphase inductance can be reduced.

The effect of canceling the magnetic fields is large as a distance between two conductors, through which adverse electric currents flow, is small, and/or an area, where the two conductors are overlapped, is large. Therefore, these are important that the interphase connecting conductors 45 and 46 are arranged as closer as possible while maintaining an electrical insulation, and the overlapped area is increased by increasing areas of the interphase connecting conductors 45 and 46 as large as possible.

Further, when operating frequencies of the switching elements 20 become high, currents flowing through the interphase connecting conductors 45 and 46 becomes like high frequencies, electric currents flow on surfaces of the interphase connecting conductors by a skin effect, and an impedance is increased. Therefore, by making shapes of the interphase connecting conductors 45 and 46 like a flat plate and increasing the surface areas of the interphase connecting conductors, it is possible to suppress an increment of the impedance caused by the skin effect.

Although, it is optimum that the interphase connecting conductors 45 and 46 are arranged at positions shown in FIGS. 3(a) and 3(b) in order to obtain an effect of reducing interphase inductance, a similar effect is obtainable by arranging the interphase connecting conductors at other positions.

Embodiment 4

Figure 4A:
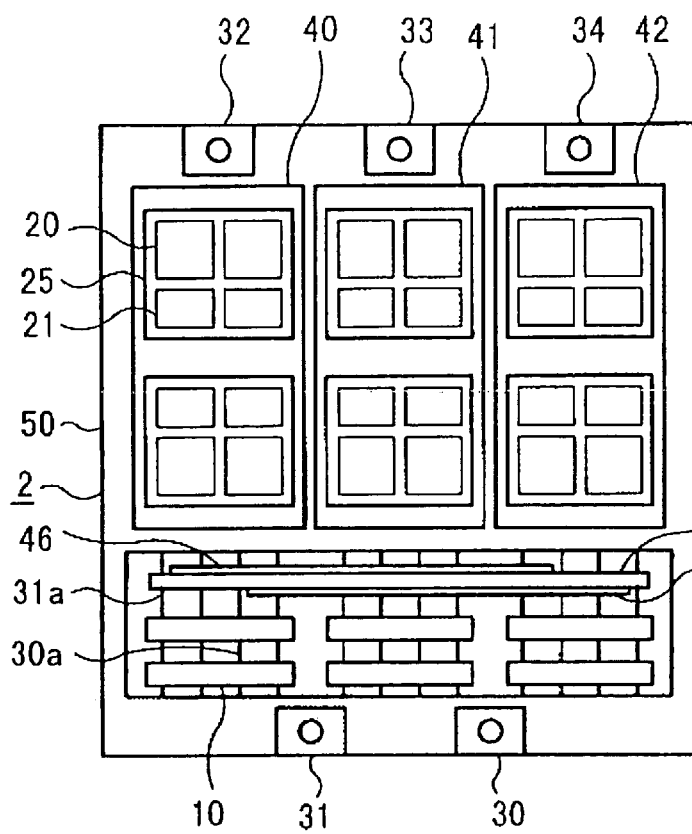
FIG. 4(a) is a plan view of an inside of a semiconductor device according to Embodiment 4 of the present invention.
Figure 4B:
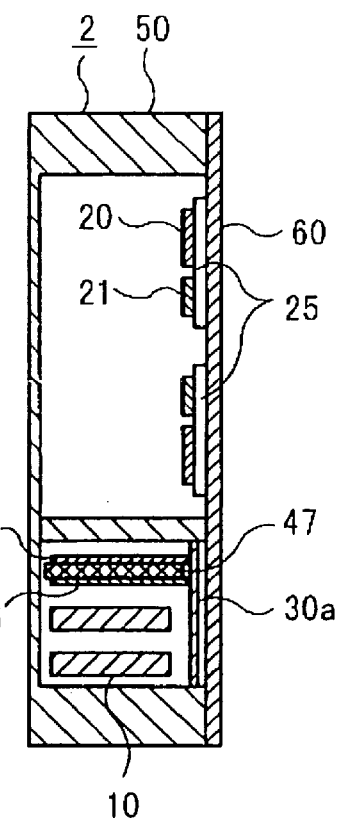
FIG. 4(b) is a cross-sectional view of the semiconductor device according to Embodiment 4 of the present invention.
Figure 4C:
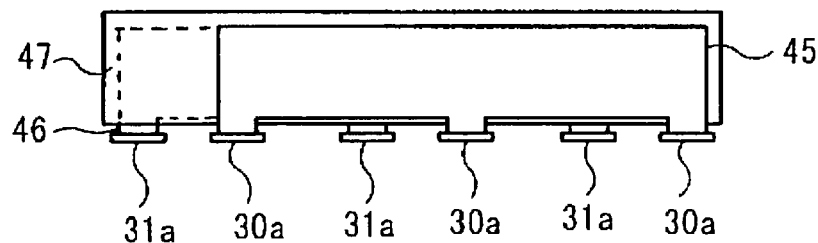
FIG. 4(c) is a front view illustrating an interphase connecting conductor.

FIG. 4(a) is a plan view of an inside of a semiconductor device according to Embodiment 4 of the present invention. FIG. 4(b) is a cross-sectional view of the semiconductor device. FIG. 4(c) is a front view of the interphase connecting conductor of the semiconductor device according to Embodiment 4 of the present invention. A structure of the semiconductor device 2 according to this embodiment is substantially similar to the structure illustrated in FIGS. 3 and 3(b). However, an insulating plate 47 is formed between interphase connecting conductors 45 and 46. The insulating plate 47 is supported by and fixed to the interphase connecting conductors 45 and 46 or a casing 50. A material of the insulating plate preferably has a high withstand voltage, is light, and has a low cost, for example, a glass epoxy plate used as a substrate of a printed wiring board. Further, when a voltage difference between the interphase connecting conductors 45 and 46 is small, there is no functional problem even though an insulating material like a thin film made of polyimide, polyethylene or the like is used.

It is needless to say that, by locating the insulating plate 47, a sufficient withstand voltage is obtained even though a gap between the interphase connecting conductors 45 and 46 is small. For example, when an electrical potential difference between the interphase connecting conductors 45 and 46 is 1 kV, it is theoretically possible to maintain a withstand voltage by a small gap of about 0.3 mm without using the insulating plate, whereby the insulating plate 47 is not necessarily required. However, in a case that the semiconductor device 2 is mounted on an electric automobile and so on, it is difficult to avoid an application of vibration to the semiconductor device 2. When the gap of the interphase connecting conductors 45 and 46 is made small without locating the insulating plate 47, the gap is changed by deformations of the interphase connecting conductors 45 and 46 by the vibration, the gap becomes that minimally required for keeping the withstand voltage or less, or at worst, a short is caused by a contact between the interphase connecting conductors 45 and 46, whereby it become difficult to maintain the insulation and the size of the device should be increased.

In this embodiment, by providing the insulating plate 47, it is possible to securely insulate using a small gap between the conductors even though a vibration is applied, and effect of canceling a magnetic field becomes large, an interphase inductance is further reduced, and the device can be miniaturized.

Embodiment 5

Figure 5A:
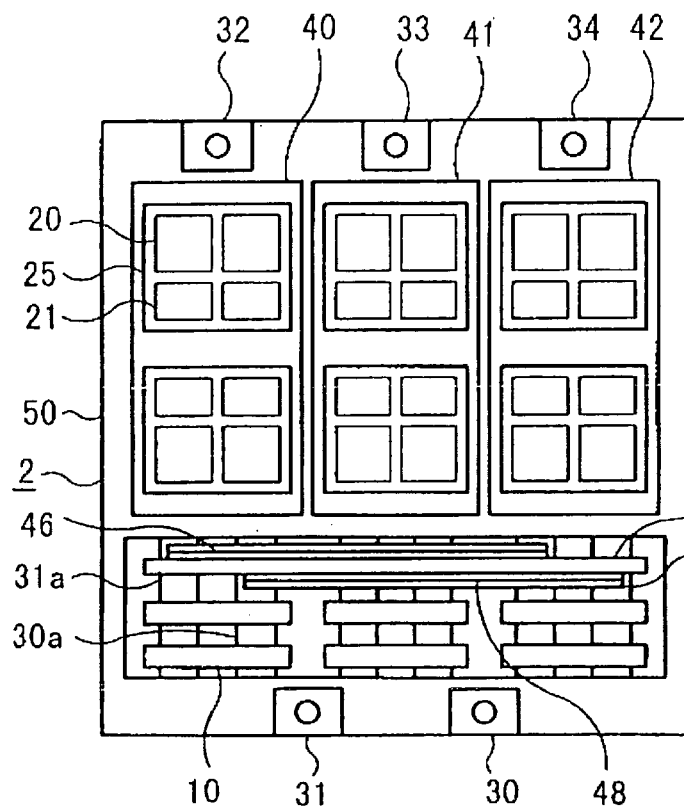
FIG. 5(a) is a plan view of an inside of a semiconductor device according to Embodiment 5 of the present invention.

FIG. 5(a) is a plan view of an inside of a semiconductor device according to Embodiment 5 of the present invention.

Figure 5B:
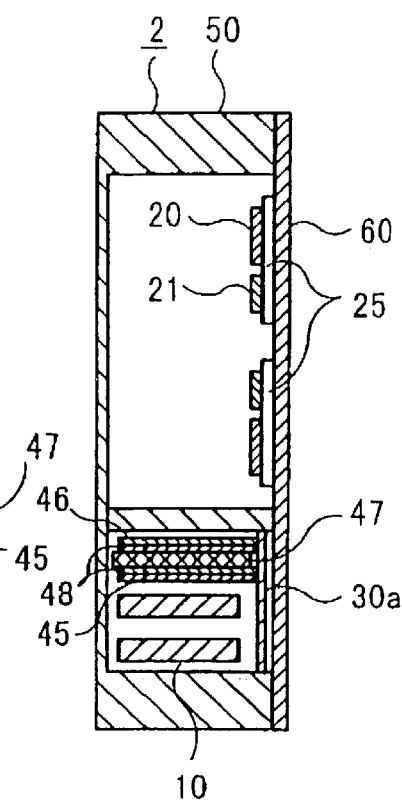
FIG. 5(b) is a cross-sectional view of the semiconductor device according to Embodiment 5 of the present invention.
Figure 5C:
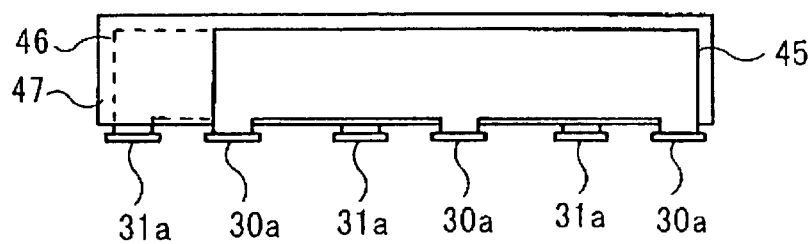
FIG. 5(c) is a front view illustrating an interphase connecting conductor.

FIG. 5(b) is a cross-sectional view of the semiconductor device. FIG. 5(c) is a front view illustrating interphase connecting conductors. Although a structure of the semiconductor device 2 according to this Embodiment is substantially similar to that in FIGS. 4(a) and 4(B), the semiconductor device according to Embodiment 5 is characterized by that planar conductors 45 and 46 are bonded to an insulating plate 47 by an adhesive layer 48.

By this, it is possible to handle the planar conductors 45 and 46 and the insulating plate 47 as a single part, whereby an assemble of the semiconductor device 2 is facilitated.

Further, even though a vibration is applied to the semiconductor device 2, a gap between the planar conductors 45 and 46 is not changed, and a stable effect of canceling a magnetic field is obtainable.

Embodiment 6

Figure 6A:
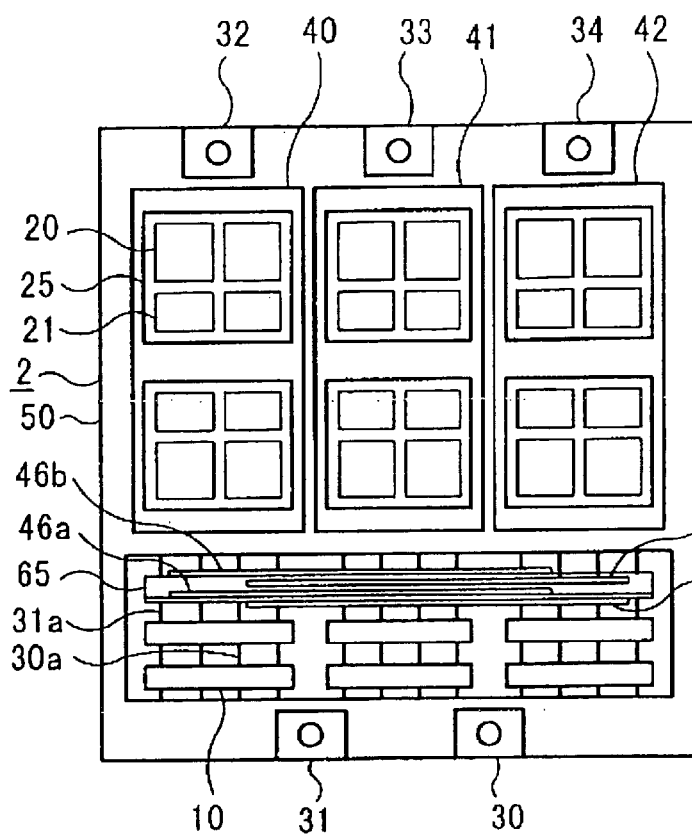
FIG. 6(a) is a plan view of an inside of a semiconductor device according to Embodiment 6 of the present invention.
Figure 6B:
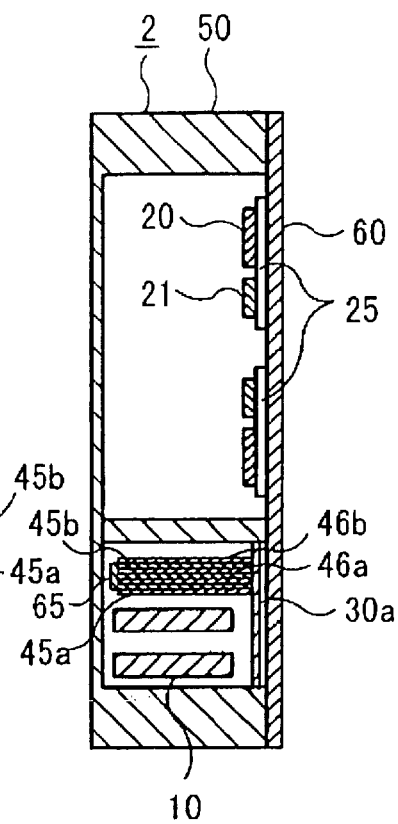
FIG. 6(b) is a cross-sectional view of the semiconductor according to Embodiment 6 of the present invention.
Figure 6C:
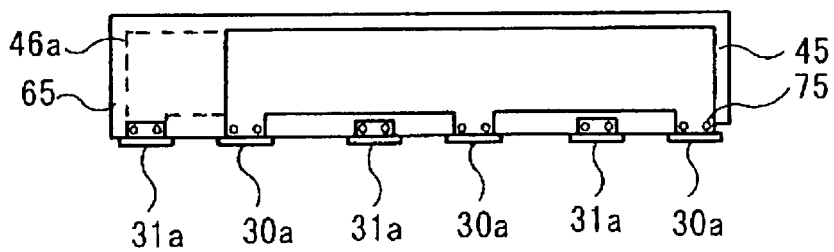
FIG. 6(c) is a front view illustrating an interphase connecting conductor.

FIG. 6(a) is a plan view of an inside of a semiconductor device according to Embodiment 6 of the present invention. FIG. 6(b) is a cross-sectional view of the semiconductor device. FIG. 6(c) is a front view illustrating interphase connecting conductors of the semiconductor device according to Embodiment 6 of the present invention. Although a structure of the semiconductor device 2 is substantially the same as the structure illustrated in FIGS. 5(a) and 5(b), it is characterized by that the interphase connecting conductors 45 and 46, fabricated by joining an insulating plate to a conductor, are formed by a single printed wiring board 65.

The printed wiring board 65 is a four-layer substrate. Interphase connecting conductors 45a and 45b, mutually connecting conductors 30a of the phases, are formed respectively on a first layer and a third layer. Interlayer connecting conductors 46a and 46b, mutually connecting conductors 31a of the phases, are respectively formed on a second layer and a fourth layer. The interphase connecting conductors 45a and 45b and the interphase connecting conductors 46a and 46b are electrically connected respectively by through holes 75.

The printed wiring board 65 is similar to those generally used for various electrical apparatuses. Accordingly, it is possible to easily form conductors having a predetermined shape and predetermined dimensions, a mass production thereof is facilitated, and procurance is easy, whereby effects similar to those in Embodiment 5 is realized for a low cost.

Meanwhile, although the number of layers of the printed wiring board 65 is four, it is easy to change the number of layers when necessary, and effects similar thereto are obtainable.

Embodiment 7

Figure 7A:
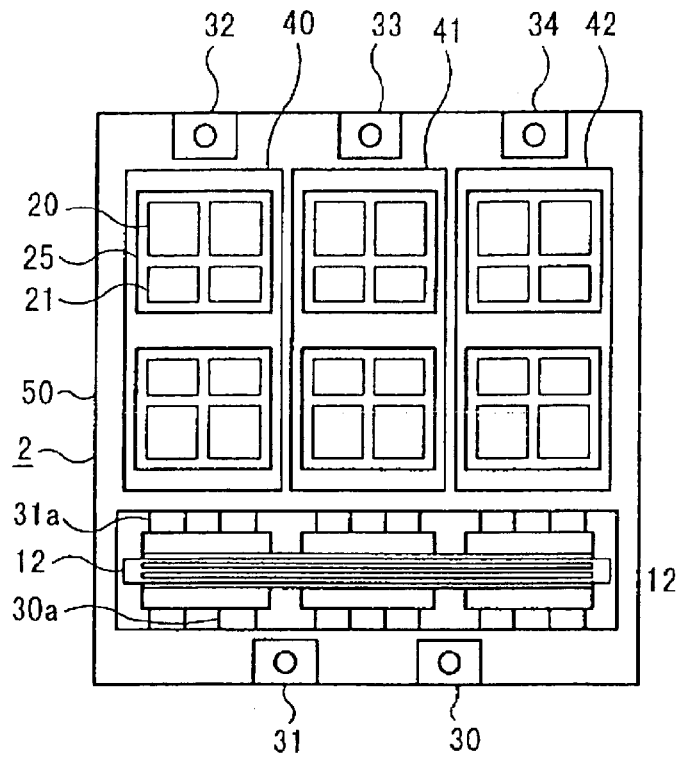
FIG. 7(a) is a plan view of an inside of a semiconductor device according to Embodiment 7 of the present invention.
Figure 7B:
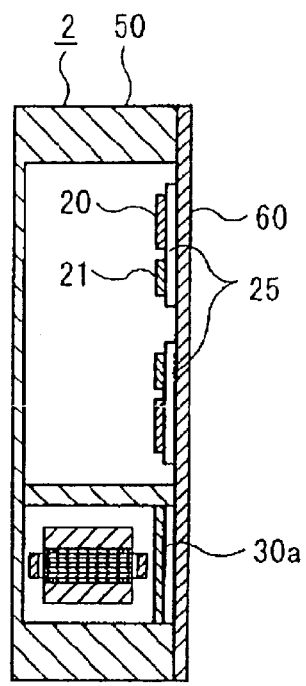
FIG. 7(b) is a cross-sectional view of the semiconductor device according to Embodiment 7 of the present invention.
Figure 7C:
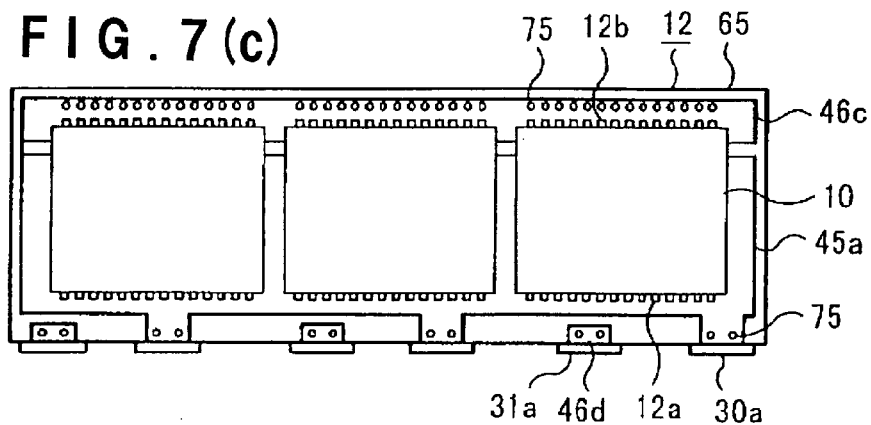
FIG. 7(c) is a front view of a capacitor module according to Embodiment 7 of the present invention.
Figure 7D:
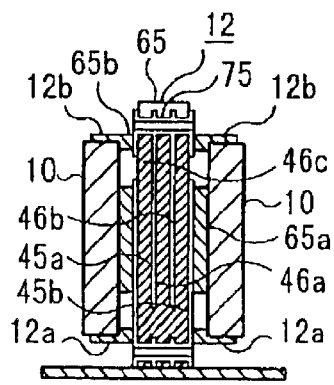
FIG. 7(d) is a cross-sectional view of the capacitor module according to Embodiment 7 of the present invention.

FIG. 7(a) is a plan view of an inside of a semiconductor device according to Embodiment 7 of the present invention. FIG. 7(b) is a cross-sectional view of the semiconductor device. FIG. 7(c) is a front view illustrating a capacitor module of the semiconductor device according to Embodiment 7 of the present invention. FIG. 7(b) is a cross-sectional view of the capacitor module. A structure of the semiconductor device 2 according to Embodiment 7 is characterized by that the capacitor module 12 is built in the semiconductor device. The capacitor module 12 is formed such that a plurality of capacitors 10 having outer terminals 12a and 12b, shaped like J, are mounted on both surfaces of a printed wiring board 65, as illustrated in FIGS. 7(c) and 7(d). An underfill 65a is located between the capacitors 10 and the printed wiring board 65 to fix the capacitors 10 to the printed wiring board 65. The printed wiring board 65 is formed by four layers, wherein interphase connecting conductors 45a, 46c, and 46d are formed on a first layer, an interphase connecting conductor 46a is formed on a second layer, an interphase connecting conductor 46b is formed on a third layer, and interphase connecting conductors 45b, 46c, and 46d are formed on a fourth layer, wherein the interphase connecting conductors 45a, 45b, 46a, and 46b are mutually overlapped in a shape of a flat plate. The interphase connecting conductors 45a and 45b are electrically connected by the through hole 75 to form a P-pole conductor, and the interphase connecting conductors 46a, 46b, 46c, and 46d are electrically connected by the through hole 75 to form an N-pole conductor. The P-pole conductor mutually connect conductors 30a in phases, and the N-pole conductor mutually connects conductors 31a in the phases. The outer terminals 12a of the capacitors 10 are joined to the P-pole conductor by a joining material 65b and are joined to the N-pole conductor by a joining material 65b. The joining material solder or a conductive board.

In this embodiment, by coating the joining material 65b at a predetermined position on the printed wiring board, and the outer terminals 12a and 12b of the capacitors 10 are aligned so as to be located on portions coated by the joining materials, the capacitors 10 are fixed to the printed wiring board 65 by the underfill 65a, and the capacitors 10, the printed wiring board 65, and the underfill 65a are applied with heat, whereby the plurality of capacitors 10 are simultaneously mounted on the surfaces, whereby a joining process is facilitated.

Further, because the capacitors 10 and the printed wiring board are handled as a single part of the capacitor module 12 when the capacitors 10 are actually mounted, an assemble of the semiconductor device is facilitated.

Further, since the capacitors 10 are fixed to the printed wiring board 65 by the underfill 65a, even though a vibration is applied to the semiconductor device, an excessive stress is not generated in the outer terminals 12a and 12b, and the joining material 65b, a lifetime and reliability of the joining portion are improved.

Further, an electric current flows from the outer terminal 12a to the outer terminal 12b inside the capacitor 10, and an electric current flows through the conductors 46a and 46b in a direction opposite to the above electric current, whereby an effect of canceling a magnetic field is demonstrated, and an inductance of an electric current path including the capacitors 10 is reduced.

For example, an electric current supplied from the capacitors passes through the interphase connecting conductors 45a, 45b, 46a, and 46b in order to suppress the variation of the ripple voltage caused at a time of switching U-phase of the semiconductor device 2. These conductors are shaped like a flat plate and overlapped each other, and electric currents flowing through the interphase connecting conductors 45a and 45b are flowed in a direction adverse to that of electric currents flowing through the interphase connecting conductors 46a and 46b. Therefore, an effect of canceling a magnetic field is demonstrated, and an inductance between the phases is reduced. This effect of cancelling the magnetic field is similarly generated when any of the phases is switched and not limited to the case that U-phase is switched.

Further, although the outer terminals 12a and 12b of the capacitors are shaped like J in this embodiment, the shape is not limited thereto, and any shape enabling mounting on a surface, e.g. a gull-wing shape, functionally works.

Further, although the number of layers of the printed wiring board is four in this embodiment, the number can be easily changed when necessary, and a similar effect is obtainable.

Embodiment 8

Figure 8A:
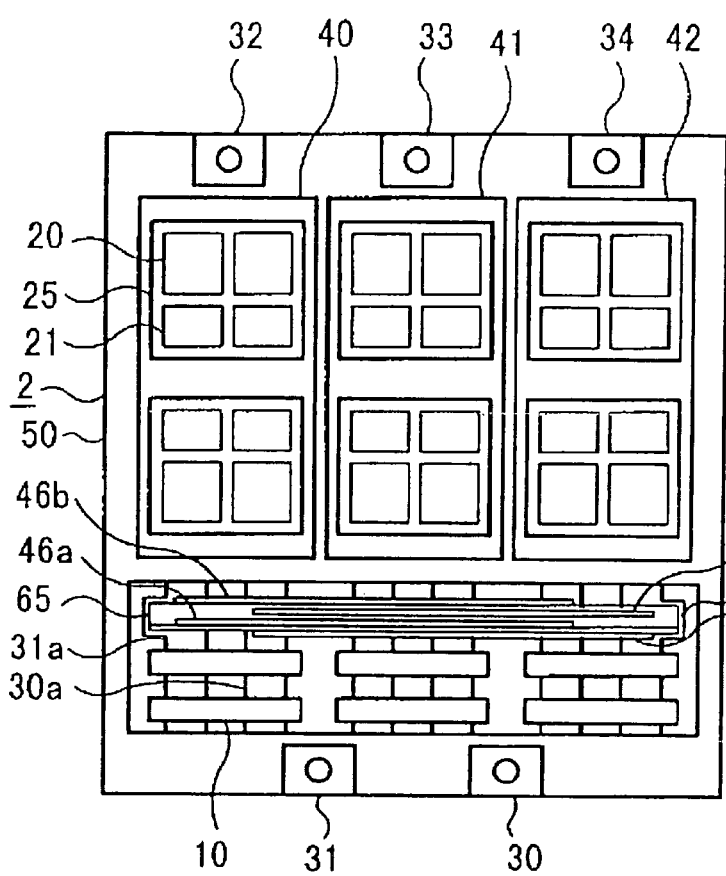
FIG. 8(a) is a plan view of an inside of a semiconductor device according to Embodiment 8 of the present invention.
Figure 8B:
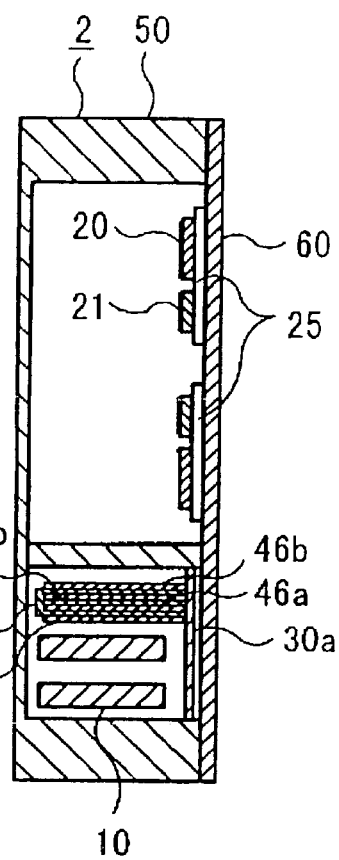
FIG. 8(b) is a cross-sectional view of the semiconductor device according to Embodiment 8 of the present invention.
Figure 8C:
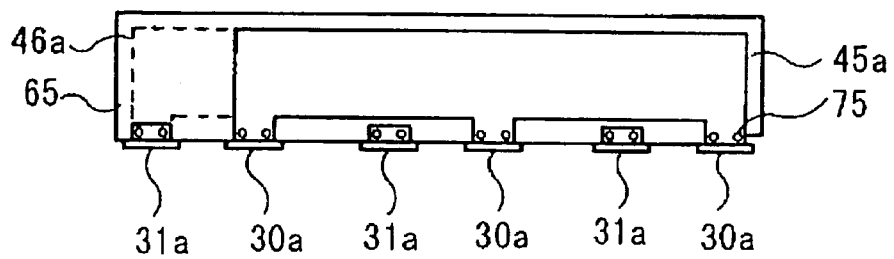
FIG. 8(c) is a front view illustrating an interphase connecting conductor.

FIG. 8(a) is a plan view of an inside of a semiconductor device according to Embodiment 8 of the present invention. FIG. 8(b) is a cross-sectional view of the semiconductor device. A structure of the semiconductor device 2 according to this embodiment is that slits 51 are formed in a casing 50, a printed wiring board 65 is aligned and supported by the slits 51.

By this structure, the printed wiring board 65 is registered inside the casing 50 by inserting the printed wiring board 65 into the slits 51, whereby an assemble of the semiconductor device 2 is facilitated, a deformation of the printed wiring board 65 is restricted by the slits 51 even though a vibration is applied to the semiconductor device 2, whereby it is possible to prevent an excessive deformation and an excessive stress from being caused in the printed wiring board 65, and shake-proof is improved.

Embodiment 9

FIG. 9(a) is a plan view of an inside of a semiconductor device according to Embodiment 9 of the present invention. FIG. 9(b) is a cross-sectional view of the semiconductor device. A structure of the semiconductor device 2 according to this embodiment is characterized by that a capacitor 10 is fixed to a supporting plate 61.

By fixing the capacitor 10 to the supporting plate 61 so as to be a single part, it is possible to handle the part by holding the supporting plate 61, whereby it is possible to assemble the capacitors 10 without touching the capacitors 10, and to prevent a mechanical breakage or an electrical breakage of the capacitors 10.

Further, although one capacitor 10 is fixed on one side of the supporting plate 61 in this embodiment, a similar effect is obtainable by fixing capacitors 10 respectively on both surfaces of the supporting plate 61, whereby a plurality of capacitors 10 are handled as a part, and an assemble of the semiconductor device is facilitated.

Embodiment 10

Figure 10A:
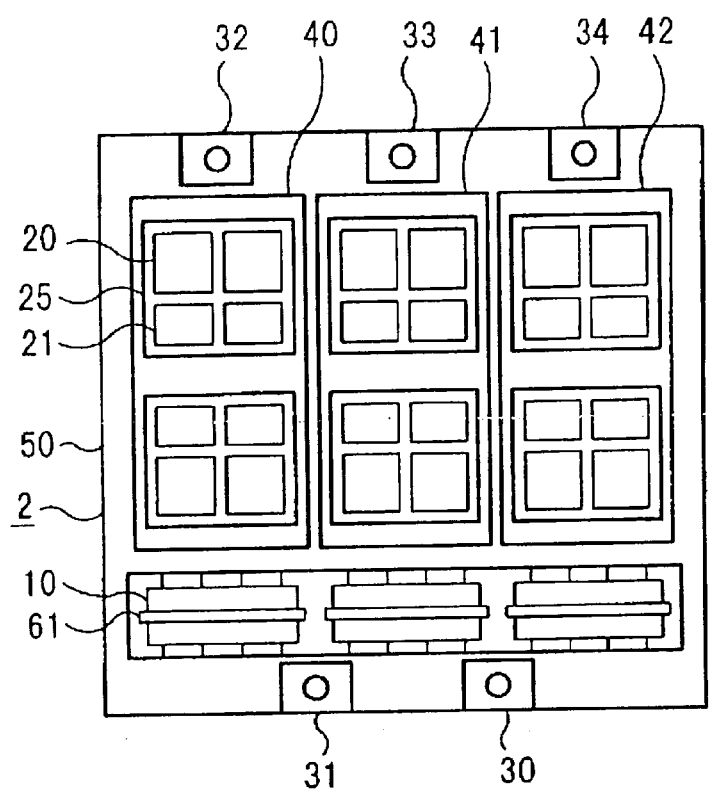
FIG. 10(a) is a plan view of an inside of a semiconductor device according to Embodiment 10 of the present invention.
Figure 10B:
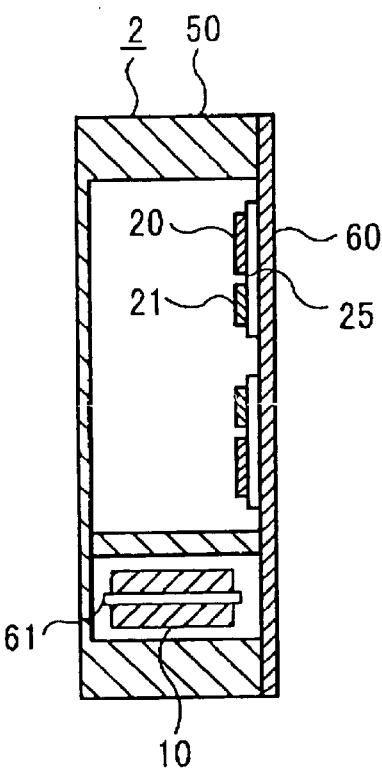
FIG. 10(b) is a cross-sectional view of the semiconductor device according to Embodiment 10 of the present invention.

FIG. 10(a) is a plan view of an inside of a semiconductor device according to Embodiment 10 of the present invention. FIG. 10(b) is a cross-sectional view of the semiconductor device. A structure of the semiconductor device 2 according to this embodiment is characterized by that a plurality of capacitors 10 are fixed to a supporting plate 61.

By forming the single part made by fixing the plurality of capacitors 10 to the supporting plate 61, it is possible to prevent the mechanical breakage or the electrical breakage of the capacitors 10 as in Embodiment 9, and the plurality of capacitors 10 can be handled as the single part, whereby an assemble of the semiconductor device is facilitated.

Embodiment 11

Figure 11A:
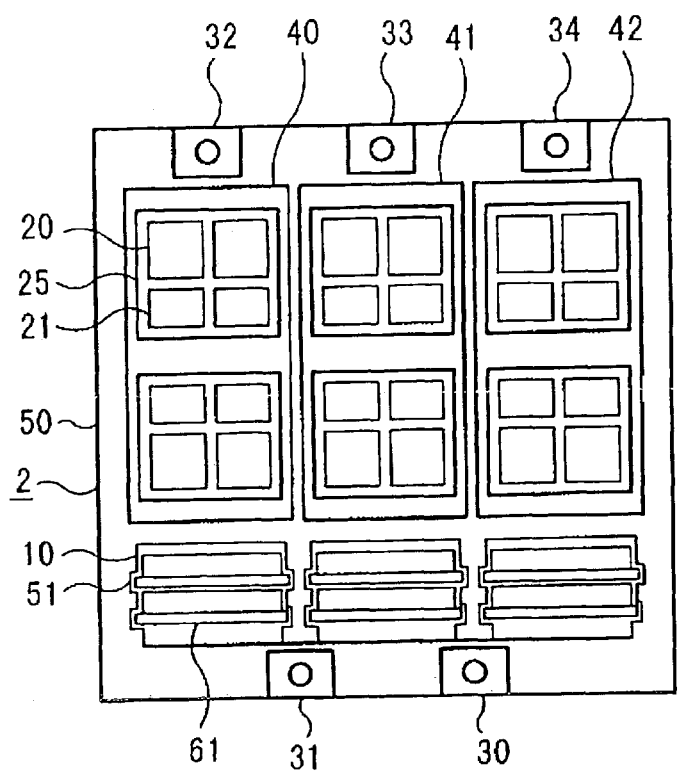
FIG. 11(a) is a plan view of an inside of a semiconductor device according to Embodiment 11 of the present invention.
Figure 11B:
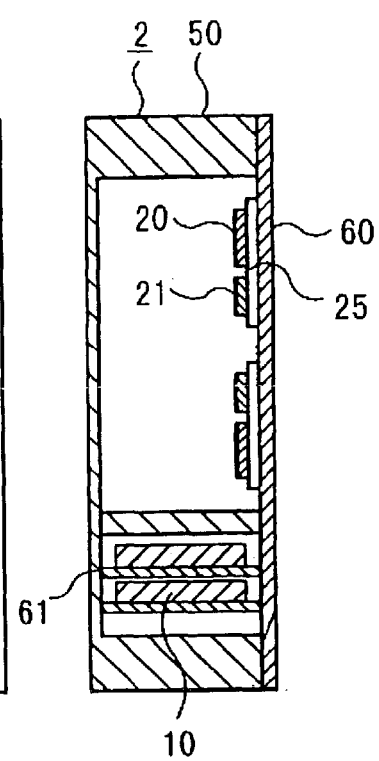
FIG. 11(b) is a cross-sectional view of the semiconductor device according to Embodiment 11 of the present invention.

FIG. 11(a) is a plan view of an inside of a semiconductor device according to Embodiment 11. FIG. 11(b) is a cross-sectional view of the semiconductor device. A structure of the semiconductor device 2 according to this embodiment. A structure of the semiconductor device 2 according to this embodiment is characterized by that slits 51 for registering and fixing a supporting plate 61, to which capacitors 10 are fixed, are formed in a casing 50.

According to this embodiment, by inserting the supporting plate 61 into the slits 51, formed in the casing 50, positions of the capacitors 10 are determined and fixed, whereby an assemble of the semiconductor device 2 becomes easy.

Embodiment 12

Figure 12A:
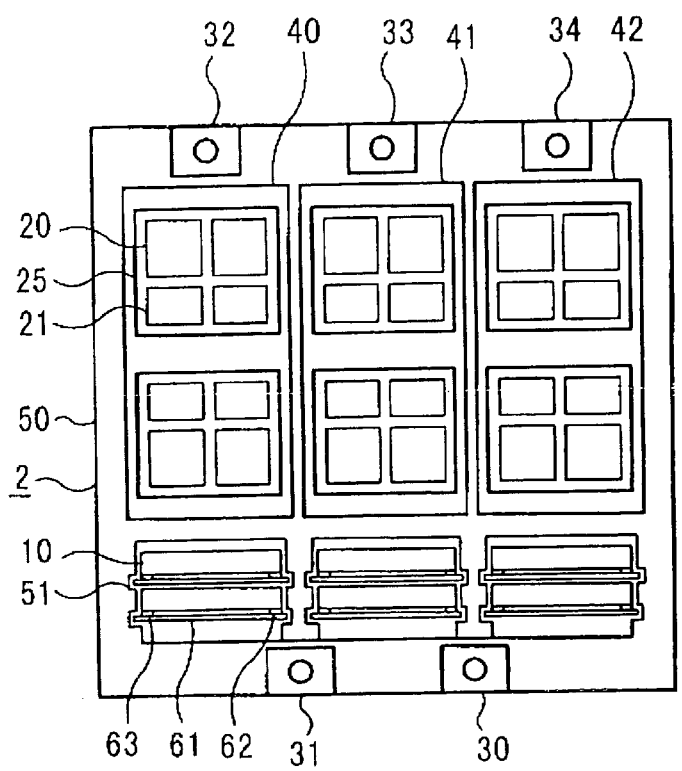
FIG. 12(a) is a plan view of an inside of a semiconductor device according to Embodiment 12 of the present invention.
Figure 12B:
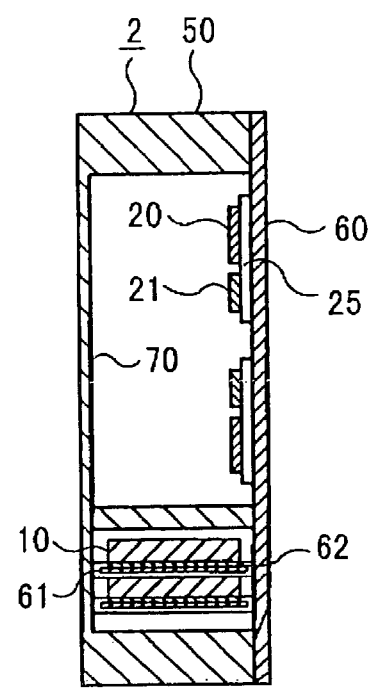
FIG. 12(b) is a cross-sectional view of the semiconductor device according to Embodiment 12 of the present invention.

FIG. 12(a) is a plan view of an inside of a semiconductor device according to Embodiment 12 of the present invention. FIG. 12(b) is a cross-sectional view of the semiconductor device. A structure of the semiconductor device 2 according to this embodiment is that conductors 62 and 63 are integrally formed in the supporting plate 61, and outer electrodes of capacitors 10 are respectively connected to P-electrode and N-electrode through the conductors 62 and 63.

According to this embodiment, because the conductors 62 and 63 are monolithically formed in the supporting plate 61, an assemble of the semiconductor device is facilitated.

Embodiment 13

FIG. 13(a) is a plan view of an inside of a semiconductor device according to Embodiment 13 of the present invention. FIG. 13(b) is a cross-sectional view of the semiconductor device. A structure of the semiconductor device according to this embodiment is that ones of electrodes of a capacitor 10 and a conductor 62, connected to P-electrode, are monolithically formed on one of surface of the supporting plate 61, and the other electrodes of the capacitor 10 and a conductor 63, connected to N-electrode, are monolithically formed on the other surface of the supporting plate 61, wherein the conductors 62 and 63 are located so as to be overlapped via the supporting plate 61 and be close to each other.

According to this embodiment, since the conductors 62 and 63 are monolithically formed on the supporting plate 61, an assemble of the semiconductor device is facilitated, adverse electric currents flow respectively through the conductors 62 and 63, and an inductance can be reduced by an effect of canceling a magnetic field.

Embodiment 14

Figure 14A:
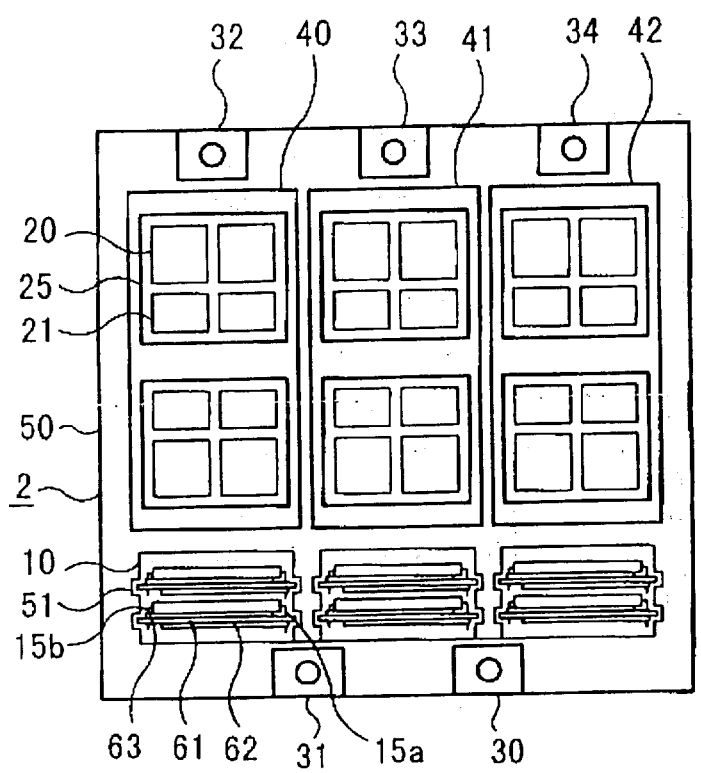
FIG. 14(a) is a plan view of an inside of a semiconductor device according to Embodiment 14 of the present invention.
Figure 14B:
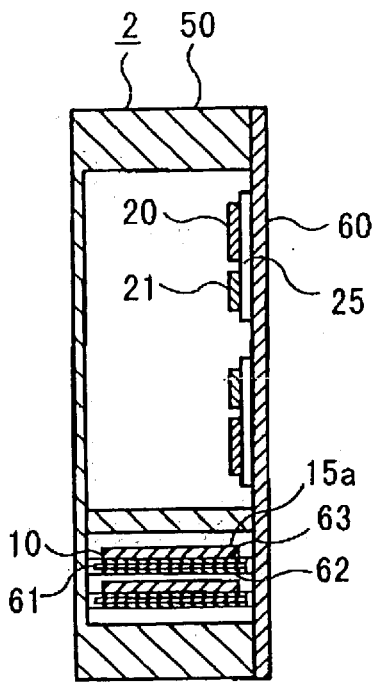
FIG. 14(b) is a cross-sectional view of the semiconductor device according to Embodiment 14 of the present invention.
Figure 14C:
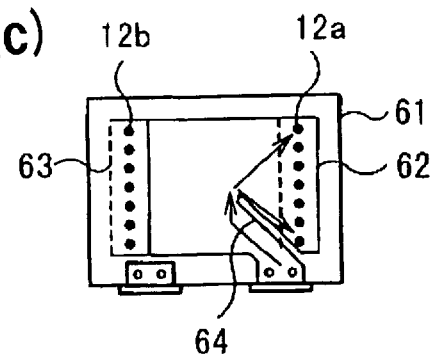
FIG. 14(c) is a front view illustrating a structure of a conductor, monolithically formed on both sides of a supporting plate.

FIG. 14(a) is a plan view of an inside of a semiconductor device according to Embodiment 14 of the present invention. FIG. 14(b) is a cross-sectional view of the semiconductor device. FIG. 14(c) is a front view illustrating a structure of a conductor, monolithically formed on both surfaces of a supporting plate. A structure of the semiconductor device 2 according to this embodiment is characterized by that a slit 64 is formed in a conductor 62 and a conductor 63, both are monolithically formed on one of the surfaces and the other surface of the supporting plate 61.

As illustrated in FIG. 14(c), a plurality of outer terminals 12a and 12b are formed in a capacitor 10, an outer terminal 12a is connected to the conductor 62, and an outer terminal 12b is connected to the conductor 63.

When the slit 64 is not formed, a current path is short, and a current is concentrated on a portion where an impedance is small, whereby a current distribution is deviated inside the capacitors 10, and the capacitances of the capacitors 10 cannot be effectively used. In this embodiment, since the slit 64 is formed, current paths to the outer terminal, arranged on one end of the capacitors 10, and to the outer terminal, arranged on the other end, are substantially equalized, as illustrated by an arrow in FIG. 14(c), a difference of impedances is reduced, and it is possible to prevent a current from concentrating on portions of the outer terminals 12a and 12b. Accordingly, it is possible to effectively utilize the capacitance of the capacitor 10, and miniaturization of the capacitors 10 and miniaturization of the semiconductor device are obtainable.

The first advantage of the semiconductor device according to the present invention is that a surge voltage is suppressed, and it is possible to prevent the switching element from being destroyed.

The second advantage of the semiconductor device according to the present invention is that the semiconductor device can be miniaturized.

The third advantage of the semiconductor device according to the present invention is that the number of components as the inverter can be reduced, the assemble can be facilitated, and the cost can be reduced.

The fourth advantage of the semiconductor device according to the present invention is that a performance of the semiconductor device can be improved.

The fifth advantage of the semiconductor device according to the present invention is that a shunt balance is improved when the device is switched, the capacitors can be miniaturized, and the semiconductor device can be miniaturized.

The sixth advantage of the semiconductor device according to the present invention is that a magnetic field is canceled, and an interphase inductance can be reduced by the effect of canceling the magnetic field.

The seventh advantage of the semiconductor device according to the present invention is that an increment of impedance can be suppressed.

The eighth advantage of the semiconductor device according to the present invention is that the effect of canceling the magnetic field is further enhanced, and the interphase inductance can be further reduced.

The ninth advantage of the semiconductor device according to the present invention is that the interphase connecting conductors and the insulating plate can be handled as the single part, and the assemble of the semiconductor device can be facilitated.

The tenth advantage of the semiconductor device according to the present invention is that the effect of canceling the magnetic field becomes stable.

The eleventh advantage of the semiconductor device according to the present invention is that the conductor having a predetermined shape and predetermined dimensions can be easily formed, and a mass production is facilitated to easily supply the semiconductor devices, whereby the cost can be reduced.

The twelfth advantage of the semiconductor device according to the present invention is that the assemble of the semiconductor device is facilitated.

The thirteenth advantage of the semiconductor device according to the present invention is that an inductance of the current path including the capacitor can be reduced.

The fourteenth advantage of the semiconductor device according to the present invention is that the inductance between the phases can be reduced.

The fifteenth advantage of the semiconductor device according to the present invention is that the assemble of the semiconductor device is facilitated, a deformation of the conductors is suppressed, and it is possible to prevent the conductors from deforming and suffering from a stress so as to improve a shake-proof capability.

The sixteenth advantage of the semiconductor device according to the present invention is that the capacitor can be built in the semiconductor device without touching a main body of the capacitor, and it is possible to prevent the capacitor from being mechanically or electrically destroyed.

The seventeenth advantage of the semiconductor device according to the present invention is that the capacitances of the capacitors can be effectively used, the semiconductor device is miniaturized, and a heat from the capacitors is equalized to elongate a lifetime of the capacitor.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2000-069770 filed on Mar. 14, 2000 including specification, claims, drawings and summary are incorporated herein by reference in its entirety.

What is claimed is:

1. A semiconductor device comprising:

P-electrodes;

N-electrodes; and capacitors in a form of a flat plate or a block, connected to a plurality of phases, respectively connected to switching elements and diodes, wherein a single or a plurality of the capacitor are respectively connected to the P-electrodes and the N-electrodes, and wherein each capacitor is connected between a positive side and a negative side of a d.c. bus in each phase.

2. The semiconductor device according to claim 1, wherein each of the P-electrodes and each of the N-electrodes are electrically connected between the switching elements and the capacitors through interphase connecting conductors.

3. The semiconductor device according to claim 2, wherein the number of the interphase connecting conductors is at least two, one of the interphase connecting conductors is connected to each of the P-electrodes, the other interphase connecting conductor is connected to each of the N-electrodes, and the interphase connecting conductors are closely arranged so as to be mutually overlapped.

4. The semiconductor device according to claim 3, wherein the interphase connecting conductors are shaped like a flat plate.

5. The semiconductor device according to claim 4, wherein insulating plates are provided between the interphase connecting conductors, shaped like a flat plate.

6. The semiconductor device according to claim 5, wherein the interphase connecting conductors, shaped like the flat plate, are bonded to the insulating plate by a bonding layer.

7. The semiconductor device according to claim 4, wherein the interphase connecting conductors are formed in a printed wiring board.

8. The semiconductor device according to claim 6, wherein outer electrodes on one side of the capacitors are connected to one of the interphase connecting conductors, and the other outer electrodes of the capacitors are connected to the other interphase connecting conductors.

9. The semiconductor device according to claim 7, wherein outer electrodes on one side of the capacitors are connected to one of the interphase connecting conductors, and the other outer electrodes of the capacitors are connected to the other interphase connecting conductors.

10. The semiconductor device according to claim 2, wherein slits are formed in a casing of the semiconductor device, and the interphase connecting conductors are registered and supported by the slits.

11. The semiconductor device according to claim 1, wherein the capacitors are supported by a supporting plate.

12. The semiconductor device according to claim 1 of the invention, a plurality of the capacitors are fixed to a side surface or the both surfaces of the supporting plate.

13. The semiconductor device according to claim 11, wherein slits are formed in the casing of the semiconductor device, and a supporting plate is registered and supported by the slit.

14. The semiconductor device according to claim 12, wherein slits are formed in the casing of the semiconductor device, and a supporting plate is registered and supported by the slit.

15. The semiconductor device according to claim 11, wherein the supporting plate is made of an insulating material, a plurality of electrically insulated conductors are monolithically formed in the supporting plate, and the capacitors are connected to the P-electrode and N-electrode through the conductors.

16. The semiconductor device according to claim 12, wherein the supporting plate is made of an insulating material, a plurality of electrically insulated conductors are monolithically formed in the supporting plate, and the capacitors are connected to the P-electrode and N-electrode through the conductors.

17. The semiconductor device according to claim 11, wherein the conductors are formed so as to be mutually overlapped on both surfaces of the supporting plate, made of the insulating material;

ones of outer electrodes of the capacitors are connected to the P-electrode through the conductors formed on one of surfaces of the supporting plate; and the other outer electrodes of the capacitors are connected to the N-electrode through the conductors, formed on the other surface of the supporting plate.

18. The semiconductor device according to claim 12, wherein the conductors are formed so as to be mutually overlapped on both surfaces of the supporting plate, made of the insulating material;

ones of outer electrodes of the capacitors are connected to the P-electrode through the conductors formed on one of surfaces of the supporting plate; and the other outer electrodes of the capacitors are connected to the N-electrode through the conductors, formed on the other surface of the supporting plate.

19. The semiconductor device according to claim 15, wherein an impedance of a current path between various portions of the outer electrodes of the capacitors and a P-electrode or an N-electrode of a power module is substantially uniformalized.

20. The semiconductor device according to claim 16, wherein an impedance of a current path between various portions of the outer electrodes of the capacitors and a P-electrode or an N-electrode of a power module is substantially uniformalized.

* * * * *